(12) United States Patent
Tomoda

(10) Patent No.: US 8,310,059 B2
(45) Date of Patent: Nov. 13, 2012

(54) SEMICONDUCTOR INTEGRATED CIRCUIT

(75) Inventor: Masafumi Tomoda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 92 days.

(21) Appl. No.: 13/009,328

(22) Filed: Jan. 19, 2011

(65) Prior Publication Data

US 2011/0175234 A1 Jul. 21, 2011

(30) Foreign Application Priority Data

Jan. 19, 2010 (JP) .................................. 2010-009063

(51) Int. Cl.
*H01L 23/528* (2006.01)
(52) U.S. Cl. ........ 257/774; 257/773; 257/776; 257/786; 257/E23.141; 257/E23.151
(58) Field of Classification Search .................. 257/773, 257/774, 776, 786, E23.151, E23.141
See application file for complete search history.

(56) References Cited

U.S. PATENT DOCUMENTS

| 6,043,539 | A * | 3/2000 | Sugasawara | 257/357 |
| 2005/0269718 | A1* | 12/2005 | Jassowski | 257/786 |
| 2010/0308458 | A1* | 12/2010 | Shinozaki et al. | 257/737 |

FOREIGN PATENT DOCUMENTS

| JP | 2001-313340 | 11/2001 |
| JP | 2007-305822 | 11/2007 |

* cited by examiner

*Primary Examiner* — Peniel M Gumedzoe
(74) *Attorney, Agent, or Firm* — Young & Thompson

(57) ABSTRACT

A semiconductor integrated circuit free from increase in chip area or significant reversion in designing is provided. The semiconductor integrated circuit includes: IO buffers arrayed in line; pad coupling wirings respectively arrayed in correspondence with the IO buffers; and IO buffer switching wirings respectively arrayed in line in correspondence with the IO buffers, set in a layer different from those of the IO buffers and the pad coupling wirings so that they overlap with part of the corresponding pad coupling wirings, and extended to other pad coupling wirings adjacent to the corresponding pad coupling wirings. Each of the IO buffer switching wirings is formed in an identical shape so that it is not short-circuited to adjacent other IO buffer switching wirings. The IO buffers are electrically coupled with the corresponding IO buffer switching wirings in the same positions.

10 Claims, 7 Drawing Sheets

FIG. 1 (EXEMPLARY EMBODIMENT 1)
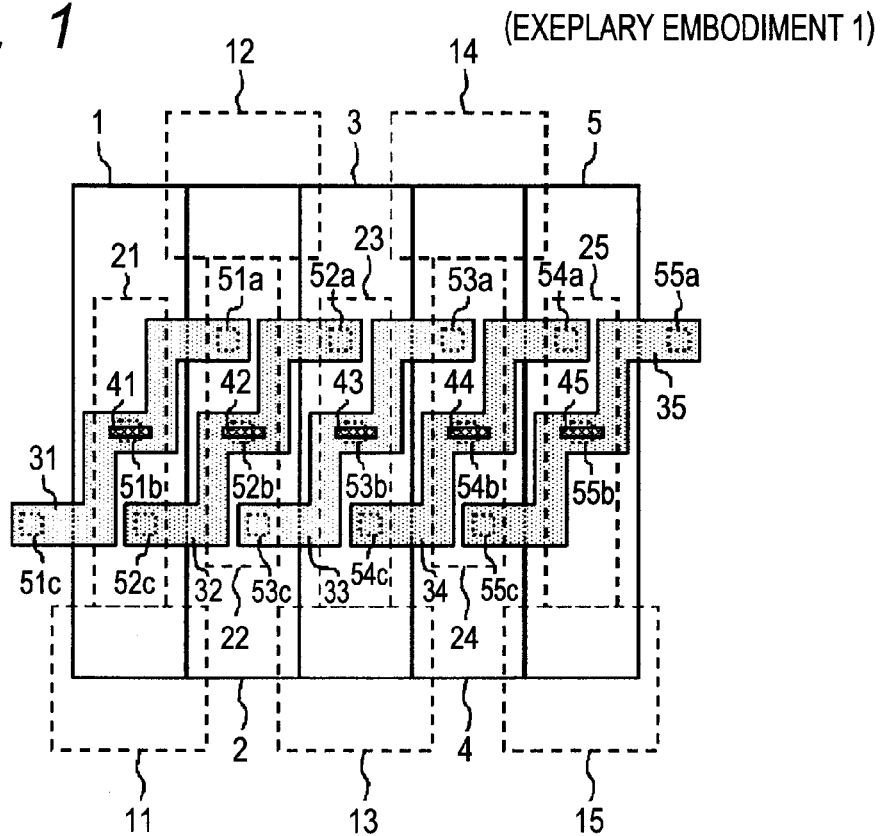
FIG. 2 (EXEMPLARY EMBODIMENT 1)
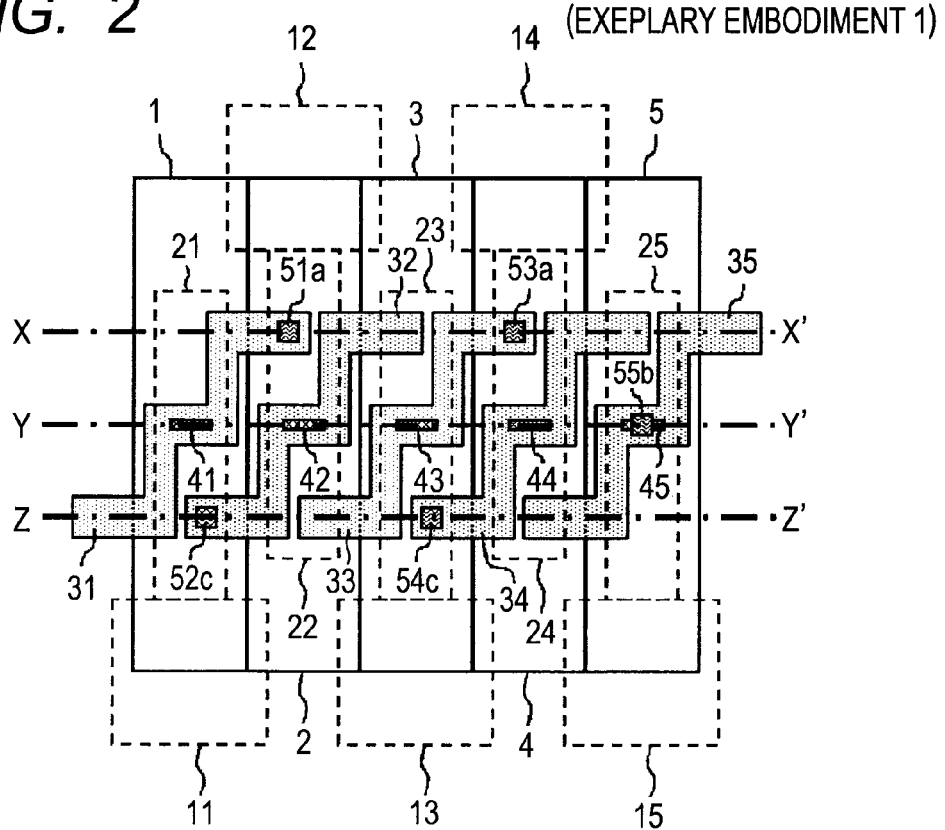

(EXEPLARY EMBODIMENT 1)

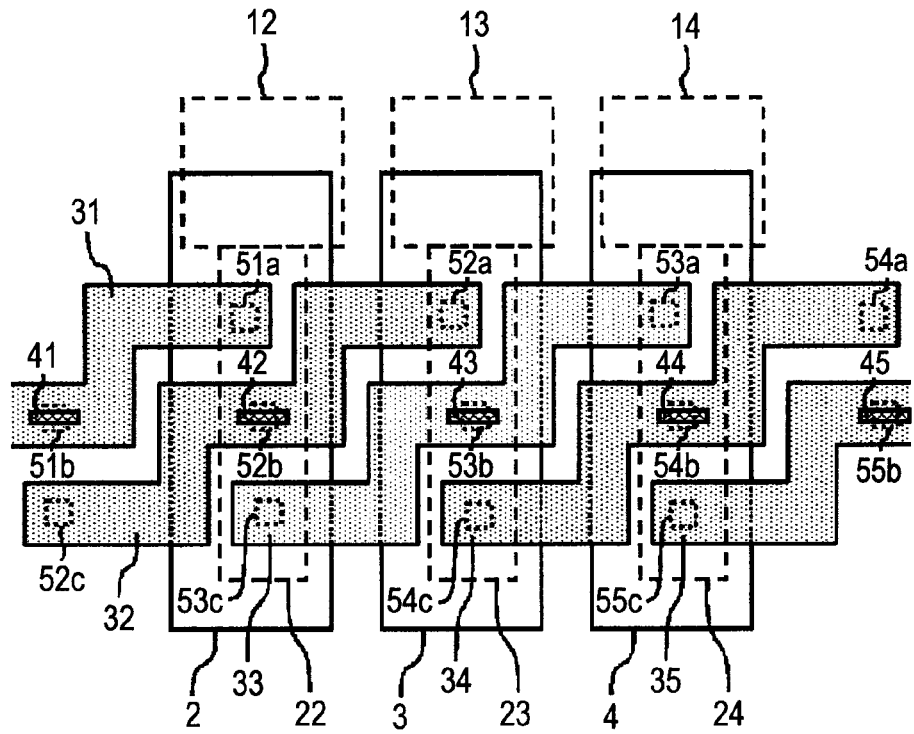
FIG. 4 (EXEPLARY EMBODIMENT 2)
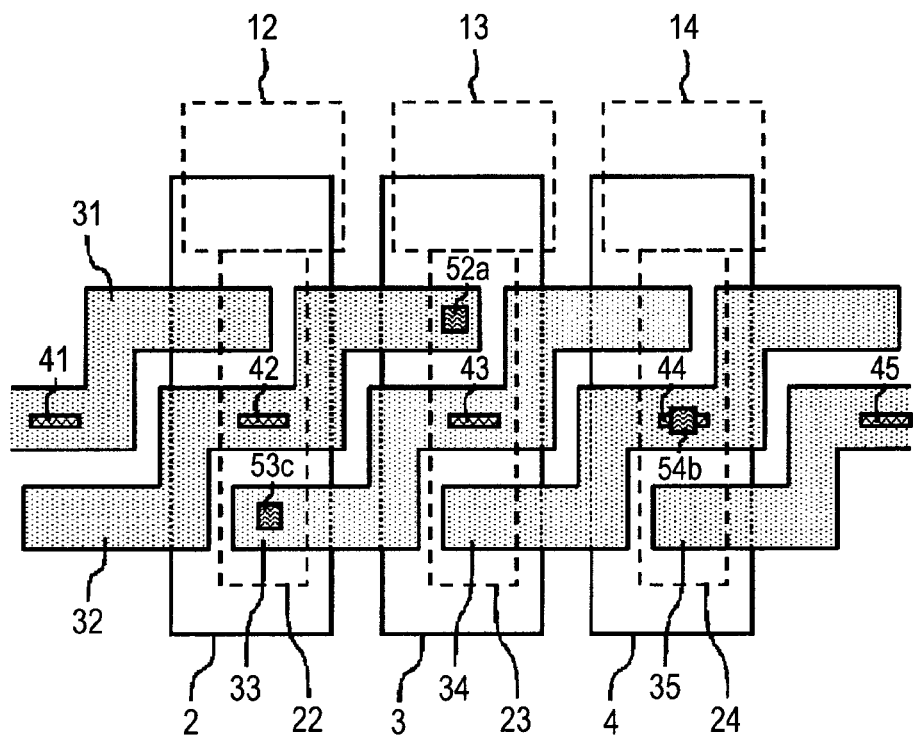
FIG. 5 (EXEPLARY EMBODIMENT 2)

FIG. 6 (EXEPLARY EMBODIMENT 3)
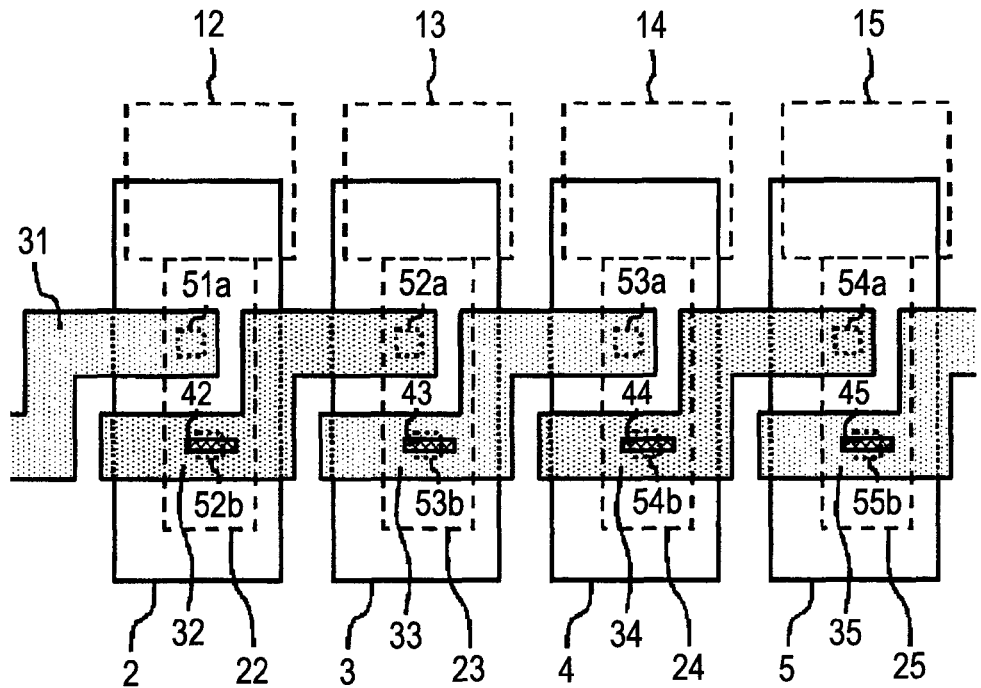
FIG. 7 (EXEPLARY EMBODIMENT 3)
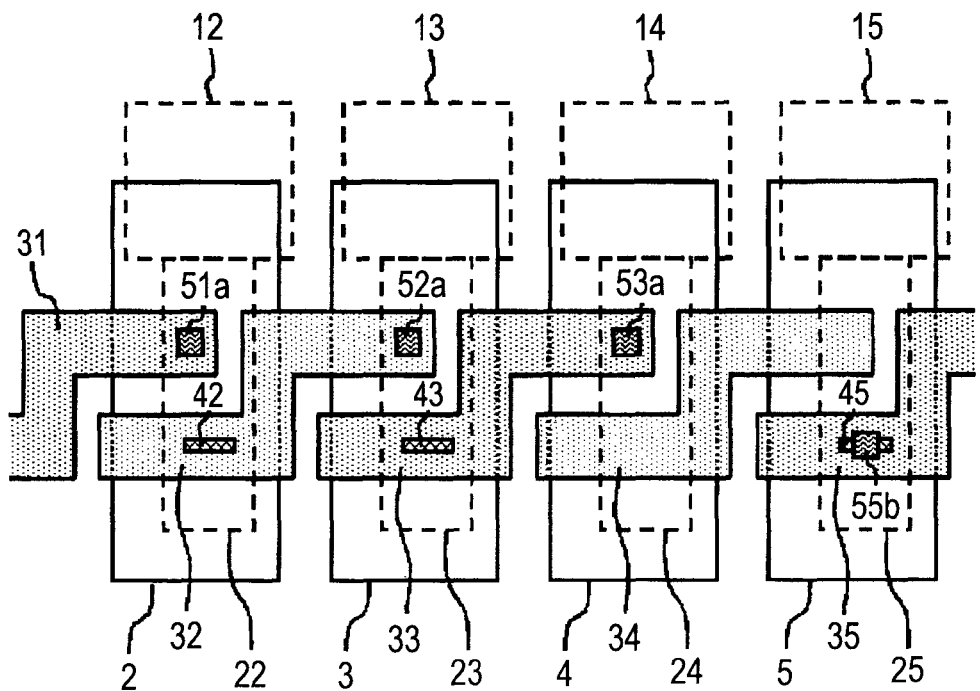

FIG. 8 (EXEPLARY EMBODIMENT 4)
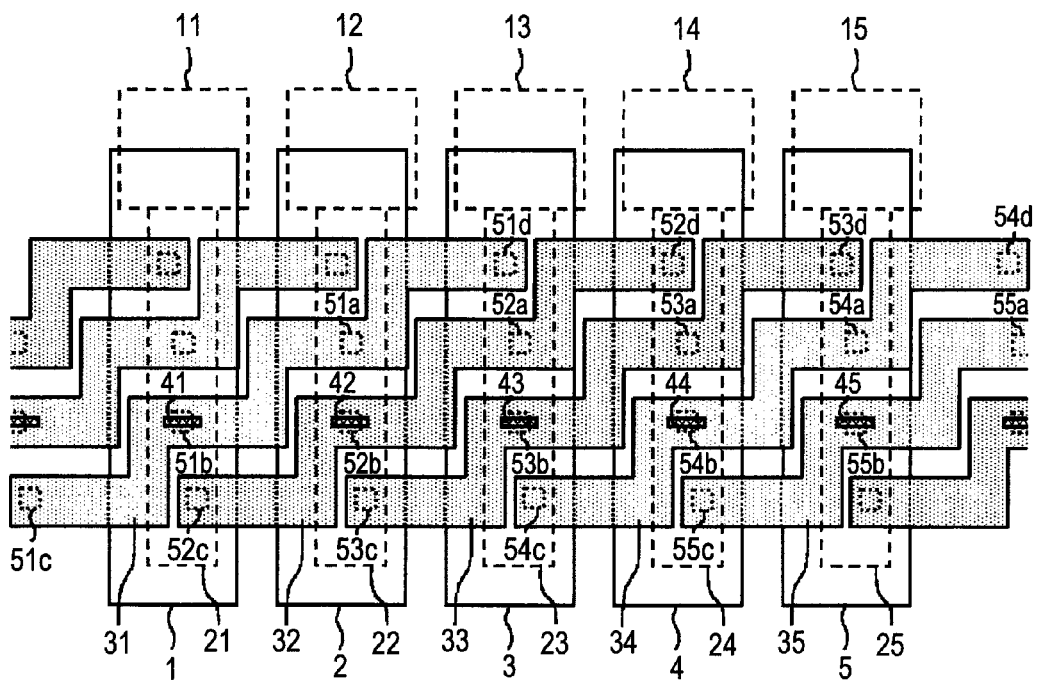
FIG. 9 (RELATED ART 1)
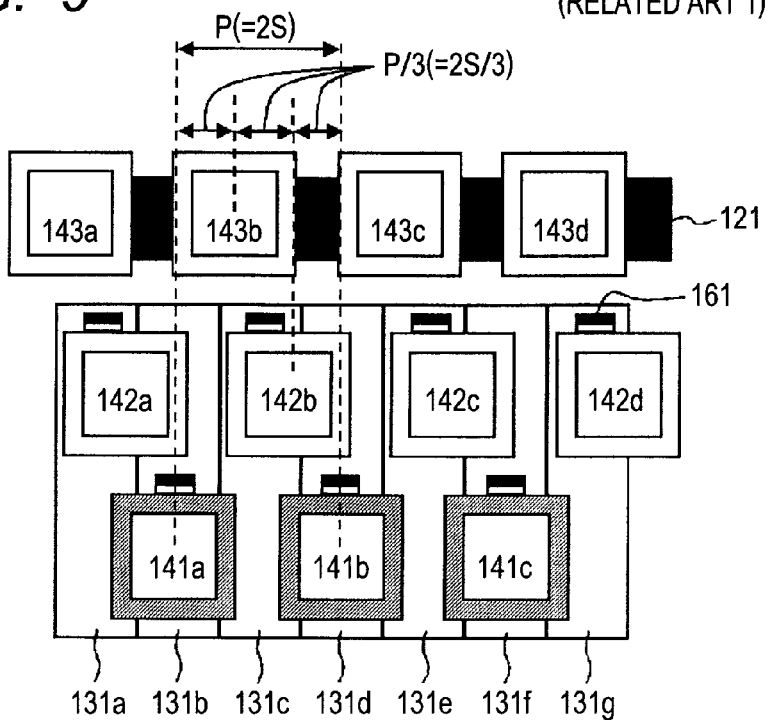

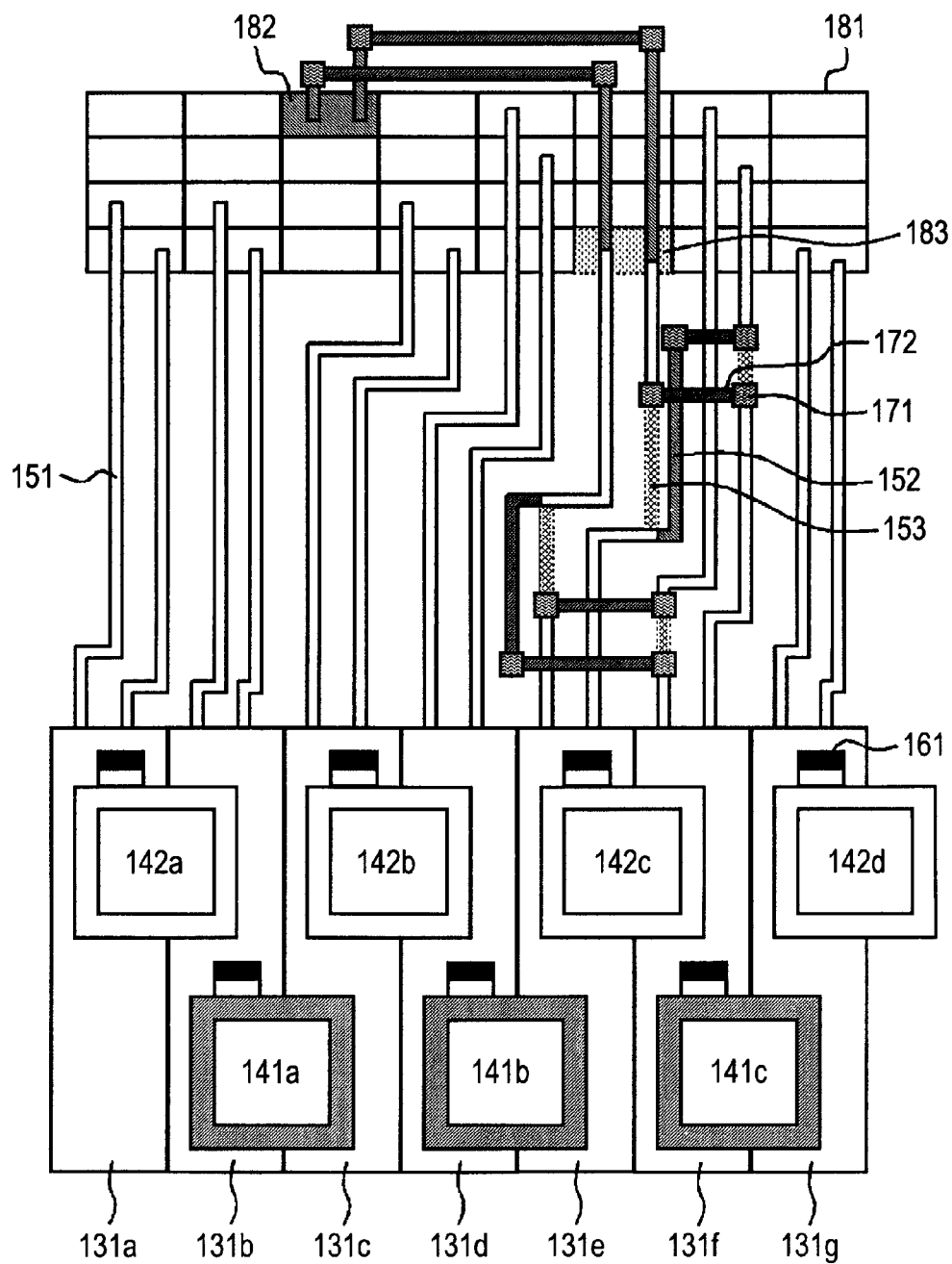
FIG. 10 (RELATED ART 1)

SEMICONDUCTOR INTEGRATED CIRCUIT

CROSS-REFERENCE TO RELATED APPLICATIONS

The disclosure of Japanese Patent Application No. 2010-9063 filed on Jan. 19, 2010 including the specification, drawings, and abstract is incorporated herein by reference in its entirety.

BACKGROUND

1. Field of the Invention

The present invention relates to semiconductor integrated circuits and in particular to a semiconductor integrated circuit with improved coupling wiring between IO buffers and bonding pads.

2. Description of Related Art

In recent semiconductor integrated circuits, the number of elements has been significantly increased with increase in or complication of equipped functions. This also significantly increases the number of input/output signals of each semiconductor integrated circuit required for implementing these functions. To make it possible to input/output a larger number of input/output signals to/from a semiconductor integrated circuit, it is necessary to set a large number of bonding pads (coupling pads). For this reason, such techniques as reduction of the pad size of bonding pads and single row arrangement of pads have been reviewed aiming at such techniques as multi-row arrangement typified by staggered arrangement.

For example, Japanese Unexamined Patent Publication No. 2007-305822 (FIG. 1) discloses a semiconductor integrated circuit in which the following measure is taken: a row of coupling pads 141a to 141c and a row of coupling pads 142a to 142d are set over IO cells 131a to 131g (IO buffers) in an IO area 30 so that they are displaced from each other; coupling pads 143a to 143d are set over a core power supply wiring 121 along one side of the core area 120; the respective pad pitches P of the coupling pads 141a to 141c, 142a to 142d, and 143a to 143d are so set that the relation of P=2S, where S is the cell pitch of the IO cells, holds; P/3 (=2S/3) is taken as the pad pitch of the entire coupling pads 141a to 141c, 142a to 142d, and 143a to 143d so that three coupling pads are set for two IO cells. (Refer to FIG. 9.) According to the patent document, this makes it possible to prevent shortage of coupling pads for power supply to a core area and obviate necessity for reducing the cell width of IO cells.

In recent years, the following practice has been used especially in ASIC (Application Specific Integrated Circuit) products and the like developed based on customer requested specifications: the arrangement of the terminals of each semiconductor integrated circuit is determined to a board substrate produced by a customer itself. However, the following takes place when electrical characteristic requirements as a requested specification are exact, when noise has large influence on adjacent wiring over a board substrate depending on the alignment sequence of terminals, or on the other like occasions: it becomes necessary at the final stage of designing to change wiring over a board substrate or its routing or rearrange the terminals of a semiconductor integrated circuit. To change the coupling of bonding pads in an existing semiconductor integrated circuit, it is inevitable to change wiring for coupling with IO buffers or the arrangement of IO buffers (IO cells). Change to wiring for coupling with IO buffers inevitably involves change to the arrangement of IO buffers and their peripheral elements to ensure a wiring area. Change to the arrangement of IO buffers leads to change or addition of the arrangement of coupled circuit elements resulting from change to the arrangement of the IO buffers, replacement of arranged elements, and change of the routing of coupling wiring. Further, change of routing increases or decreases the delay of coupling wiring and this degrades electrical characteristics. This requires major changing work such as second review of the arrangement of elements or review of wiring and accompanying detailed verification of operation, arrangement, and the like. As a result, a significant reversion is inevitable in designing. The number of functions and elements equipped in each semiconductor integrated circuit will be continuously increased in the future and a larger number of bonding pads will be arranged. This will also increase the occurrences of rearrangement of terminals. Therefore, a method that facilitates rearrangement of terminals is demanded.

As a technique that makes it possible to rearrange terminals, for example, Japanese Unexamined Patent Publication No. 2007-305822 (FIG. 1) discloses a semiconductor integrated circuit in which the following measure is taken: lead-in wirings 211 to 216 for external terminals coupled to external terminals 201 to 206 and lead-in wirings 221 to 226 for internal circuits coupled to internal circuits are located in an identical wiring layer; and wiring line segments 241 to 243 for coupling lead-in wirings over two wiring layers sandwiching it are arranged so that the following is implemented: they are alternated between the upper layer and the lower layer and the two wiring layers intersect with the lead-in wirings for internal circuits and one of the two wiring layers intersects with the lead-in wirings for external terminals. The relation of coupling between the internal circuits and the external terminals is modified by changing the arrangement of contacts 231 to 234 coupling the wiring layers together. (Refer to FIG. 11.)

SUMMARY

In the semiconductor integrated circuit described in Japanese Unexamined Patent Publication No. 2001-313340 (FIG. 2), the relation of coupling between external terminals and internal circuits is changed using three wiring layers. However, in cases where the relation of coupling is changed over IO cells (for example, CUP: Circuit Under Pad) without providing a new wiring area for this change of the relation of coupling to avoid increase in chip area, use of three layers is disadvantageous. If the number of wiring layers is reduced from three layers to two layers (Refer to FIG. 12), the following takes place. Contacts 252, 253 couple together lead-in wirings 211, 212 for external terminals in the first layer and corresponding wiring line segments 261, 262 for coupling lead-in wiring in the second layer. In this case, the contacts cannot be set in positions where the distances from corresponding external terminals 201, 202 are equal. Therefore, it is necessary to prepare multiple kinds of IO cells 271, 272. When multiple kinds of IO cells 271, 272 are prepared, there is a possibility that the chip area is increased.

It is a major object of the invention to provide a semiconductor integrated circuit that can be designed without increase in chip area or a significant reversion.

According to an aspect of the invention, a semiconductor integrated circuit includes: multiple IO buffers arrayed in line; multiple pad coupling wirings respectively arrayed in correspondence with the IO buffers and set in a layer different from that of the IO buffers; and multiple IO buffer switching wirings respectively arrayed in line in correspondence with the IO buffers, set in a layer different from those of the IO buffers and the pad coupling wirings so that they overlap with part of the corresponding pad coupling wirings, and extended to another pad coupling wiring set next to or farther away from the corresponding pad coupling wiring. Each the IO buffer switching wiring is formed in the same shape so that it is not short-circuited to adjacent IO buffer switching wirings. Each the IO buffer is electrically coupled with the corresponding IO buffer switching wiring in the same position.

In the semiconductor integrated circuit of the invention, it is desirable that each the IO buffer switching wiring should be formed in a stairway shape and have one or more steps.

In the semiconductor integrated circuit of the invention, it is desirable that a portion wired by extending each the IO buffer switching wiring should be set as follows: it should be set on either or both sides of an area where it overlaps with part of the corresponding pad coupling wiring in the direction of column.

In the semiconductor integrated circuit of the invention, it is desirable that each the IO buffer switching wiring should be set as follows: it should be set between the corresponding IO buffer and the corresponding pad coupling wiring at a distance from them.

It is desirable that the semiconductor integrated circuit of the invention should include multiple pads coupled with the corresponding IO buffer switching wirings and the pads should be arranged in a staggered pattern or in a single row.

It is desirable that the semiconductor integrated circuit of the invention should include: multiple first vias set in correspondence with the IO buffers and coupling together the corresponding IO buffers and the corresponding IO buffer switching wirings; and multiple second vias capable of electrically coupling together the IO buffer switching wirings and the corresponding pad coupling wirings or the other pad coupling wirings.

In the semiconductor integrated circuit of the invention, it is desirable that the following measure should be taken when each the second via electrically couples together the IO buffer switching wiring and the corresponding pad coupling wiring: the second via is set in a position where it overlaps with the corresponding first via.

In the semiconductor integrated circuit of the invention, it is desirable that the following measure should be taken when each the second via electrically couples together the IO buffer switching wiring and the other pad coupling wiring: the second via should be set in a position where it is displaced from the corresponding first via in the direction of row.

In the semiconductor integrated circuit of the invention, it is desirable that of the multiple IO buffer switching wirings, a predetermined IO buffer switching wiring should be not coupled to the IO buffer through the corresponding first via.

In the semiconductor integrated circuit of the invention, it is desirable that of the multiple IO buffer switching wirings, a predetermine IO buffer switching wiring should be not coupled to the corresponding pad coupling wiring or the other pad coupling wiring through the corresponding second via.

According to the invention, the relation of coupling between pad coupling wirings and IO buffers can be changed in a short time by setting the IO buffer switching wirings astride multiple pad coupling wirings. Each the IO buffer switching wiring is formed in the same shape so that it is not short-circuited to adjacent IO buffer switching wirings. As a result, it is possible to electrically couple each IO buffer with the corresponding IO buffer switching wiring through a via or the like in the same position. This makes it unnecessary to prepare multiple IO buffers and a chip area is not increased.

BRIEF DESCRIPTION OF THE DRAWINGS

FIG. 1 is a plan view partly illustrating the configuration of an IO area in a semiconductor integrated circuit in Exemplary Embodiment 1 of the invention;

FIG. 2 is a plan view partly illustrating an example of a wiring coupling method in an IO area in a semiconductor integrated circuit in Exemplary Embodiment 1 of the invention;

FIG. 4 is a plan view partly illustrating the configuration of an IO area in a semiconductor integrated circuit in Exemplary Embodiment 2 of the invention;

FIG. 5 is a plan view partly illustrating an example of a wiring coupling method in an IO area in a semiconductor integrated circuit in Exemplary Embodiment 2 of the invention;

FIG. 6 is a plan view partly illustrating the configuration of an IO area in a semiconductor integrated circuit in Exemplary Embodiment 3 of the invention;

FIG. 7 is a plan view partly illustrating an example of a wiring coupling method in an IO area in a semiconductor integrated circuit in Exemplary Embodiment 3 of the invention;

FIG. 8 is a plan view partly illustrating the configuration of an IO area in a semiconductor integrated circuit in Exemplary Embodiment 4 of the invention;

FIG. 9 is a plan view partly illustrating an example of part of an IO area and part of a core area of a semiconductor integrated circuit in Related Art 1;

FIG. 10 is a plan view partly illustrating an example of a wiring coupling method in an IO area in a semiconductor integrated circuit in Related Art 1;

DETAILED DESCRIPTION OF THE PREFERRED EMBODIMENTS

A semiconductor integrated circuit in an embodiment of the invention includes: multiple IO buffers (1 to 5 in FIG. 1) arrayed in line; multiple pad coupling wirings (21 to 25 in FIG. 1) respectively arrayed in correspondence with the IO buffers and set in a layer different from that of the IO buffers; and multiple IO buffer switching wirings (31 to 35 in FIG. 1) respectively arrayed in a line in correspondence with the IO buffers, set in a layer different from those of the IO buffers and the pad coupling wirings so that they overlap with part of the corresponding pad coupling wirings, and extended to another pad coupling wiring set next to or farther away from the corresponding pad coupling wiring. Each the IO buffer switching wiring is formed in the same shape so that it is not short-circuited to adjacent IO buffer switching wirings. Each the IO buffer is electrically coupled with the corresponding IO buffer switching wiring in the same position.

Exemplary Embodiment 1

Figure 3:
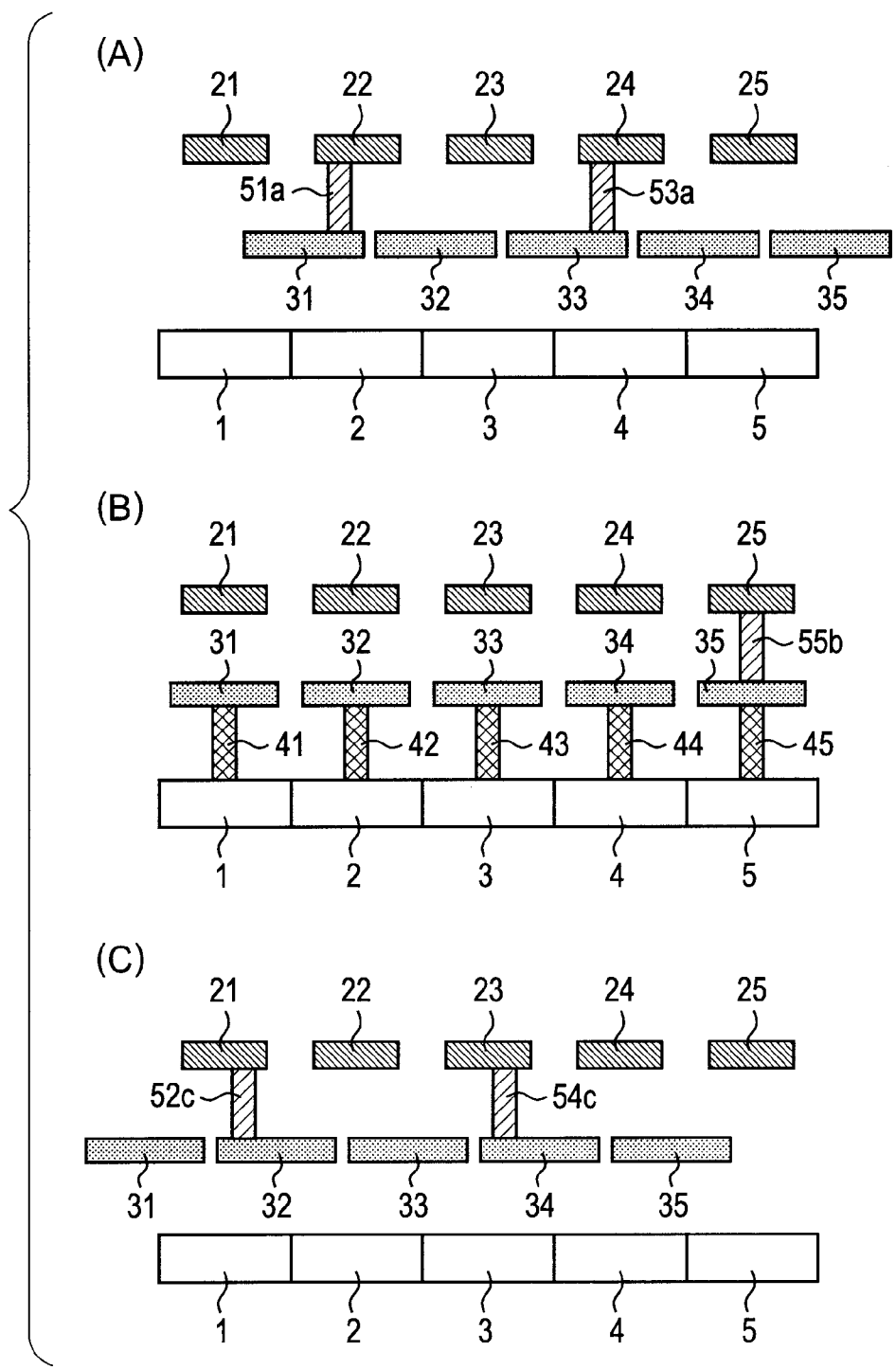
FIG. 3A is a sectional view taken along line X-X' of FIG. 2 partly illustrating the example of the wiring coupling method in the IO area in the semiconductor integrated circuit in Exemplary Embodiment 1 of the invention.
FIG. 3B is a sectional view taken along line Y-Y' of FIG. 2.
FIG. 3C is a sectional view taken along line Z-Z' of FIG. 2.
Figure 11:
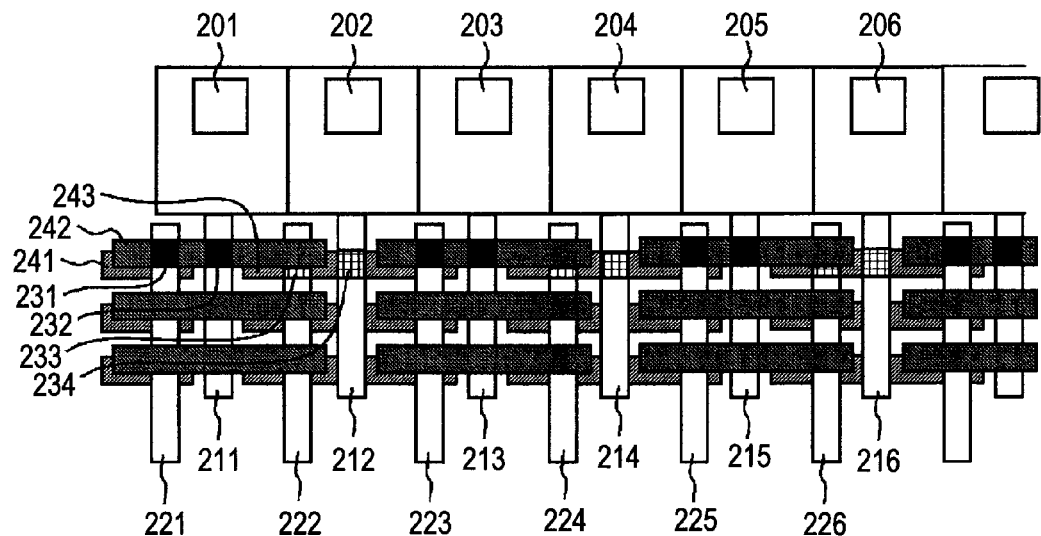
FIG. 11 is a plan view partly illustrating an example of a wiring coupling method in a semiconductor integrated circuit in Related Art 2.
Figure 12:
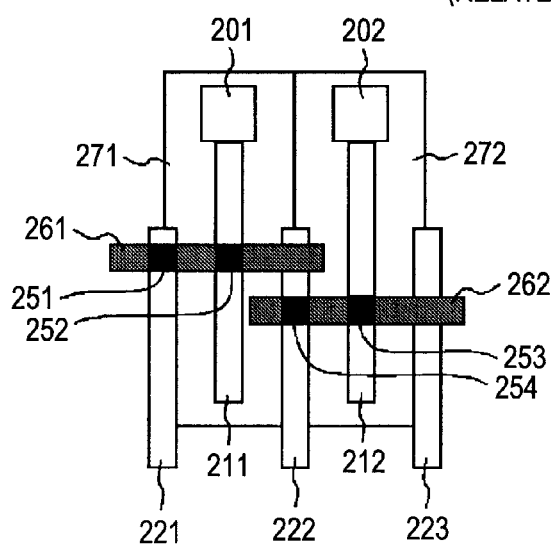
FIG. 12 is a plan view partly illustrating an example of a wiring coupling method in a semiconductor integrated circuit in Related Art 2.

Description will be given to a semiconductor integrated circuit in Exemplary Embodiment 1 of the invention with reference to the drawings. FIG. 1 is a plan view partly illustrating the configuration of an IO area in the semiconductor integrated circuit in Exemplary Embodiment 1 of the invention. FIG. 2 is a plan view partly illustrating an example of a wiring coupling method in an IO area in the semiconductor integrated circuit in Exemplary Embodiment 1 of the invention. FIG. 3A is a sectional view taken along line X-X' of FIG. 2 partly illustrating the example of the wiring coupling method in the IO area in the semiconductor integrated circuit in Exemplary Embodiment 1 of the invention; FIG. 3B is a sectional view taken along line Y-Y' of FIG. 2; and FIG. 3C is a sectional view taken along line Z-Z' of FIG. 2.

As illustrated in FIG. 1, the semiconductor integrated circuit includes the following in the IO area where signals and the like are inputted and outputted: IO buffers 1 to 5, bonding pads 11 to 15, pad coupling wirings 21 to 25, IO buffer switching wirings 31 to 35, vias 41 to 45, and vias 51a to 51c, 52a to 52c, 53a to 53c, 54a to 54c, 55a to 55c. All the vias 51a to 51c, 52a to 52c, 53a to 53c, 54a to 54c, 55a to 55c do not exist in the IO area and they are set according to customer requested specifications.

The IO buffers 1 to 5 are circuits used to absorb the influences of fluctuation in the input/output speed of inputted/outputted signals and the like, their backflow, and load fluctuation. For example, an input circuit element, an output circuit element, an ESD protection element, and the like can be used as the IO buffers. The IO buffers 1 to 5 are arranged in line in the IO area from the left side in FIG. 1. The internal circuits of the IO buffers 1 to 5 are formed in the third highest wiring layer (third layer) and lower wiring layers. Over the IO buffer 1, part (all is also acceptable) of the bonding pad 11 and the pad coupling wiring 21 coupled to the bonding pad 11 are set at a certain distance from the IO buffer 1. Also over the IO buffers 2 to 5, similarly, part (all is also acceptable) of the bonding pads 12 to 15 and the pad coupling wirings 22 to 25 coupled to the bonding pads 12 to 15 are set. The IO buffers 1 to 5 are electrically coupled with the corresponding IO buffer switching wirings 31 to 35 through the corresponding vias 41 to 45. The positions where the IO buffers 1 to 5 and the corresponding vias 41 to 45 are coupled with each other are similar positions. In the example in FIG. 1, the positions are similarly located in the respective central parts of the IO buffer 1 to 5. This makes it unnecessary to prepare multiple kinds of IO buffers.

The bonding pads 11 to 15 are terminals (external coupling terminals, coupling pads) for electrical coupling to external sources. The bonding pads 11 to 15 are respectively coupled with the corresponding pad coupling wirings 21 to 25. The bonding pads 11 to 15 are respectively set over the corresponding IO buffers 1 to 5 with a predetermined distance in between. The bonding pads 11 to 15 are formed in the uppermost wiring layer (first layer). The bonding pads 11, 13, are set in proximity to the ends of the IO buffers 1, 3, 5 located on the lower side in FIG. 1. The bonding pads 12, 14 are set in proximity to the ends of the IO buffers 2, 4 located on the upper side in FIG. 1. That is, the bonding pads 11 to 15 are arranged in a staggered configuration and the odd-numbered bonding pads are located on the lower side and the even-numbered bonding pads are located on the upper side.

The pad coupling wirings 21 to 25 are used for coupling to the corresponding bonding pads 11 to 15. The pad coupling wirings 21 to 25 are respectively wired within the respective areas of the IO buffers 1 to 5. The pad coupling wirings 21 to 25 are respectively set over the IO buffers 1 to 5 with a predetermined distance in between. The pad coupling wirings 21 to 25 are formed in the uppermost wiring layer (first layer) as the bonding pads 11 to 15 are. The pad coupling wiring 21 can be electrically coupled with the IO buffer switching wiring 31 or the IO buffer switching wiring 32 through the via 51b or the via 52c in FIG. 1. The pad coupling wiring 22 can be electrically coupled with the IO buffer switching wiring 31, buffer switching wiring 32, or IO buffer switching wiring 33 through the via 51a, via 52b, or via 53c. The pad coupling wiring 23 can be electrically coupled with the IO buffer switching wiring 32, IO buffer switching wiring 33, or IO buffer switching wiring 34 through the via 52a, via 53b, or via 54c. The pad coupling wiring 24 can be electrically coupled with the IO buffer switching wiring 33, IO buffer switching wiring 34, IO buffer switching wiring 35 through the via 53a, via 54b, or via 55c. The pad coupling wiring 25 can be electrically coupled with the IO buffer switching wiring 34 or the IO buffer switching wiring 35 through the via 54a or the via 55b in FIG. 1.

The IO buffer switching wirings 31 to 35 are used to change a bonding pad (pad coupling wiring) to be switched electrically coupled with a corresponding IO buffer 1 to 5. The IO buffer switching wirings 31 to 35 are set between the buffers 1 to 5 and the pad coupling wirings 21 to 25 at distances from the IO buffers 1 to 5 and the pad coupling wirings 21 to 25. The IO buffer switching wirings 31 to 35 are formed in the second highest wiring layer (second layer). The IO buffer switching wirings 31 to 35 are set over and astride multiple (three in FIG. 1) IO buffers 1 to 5 (pad coupling wirings 21 to 25) so that they are not short-circuited to adjacent IO buffer switching wirings. In FIG. 1, the IO buffer switching wirings 31 to 35 are set over and astride three IO buffers: the corresponding IO buffer 1 to 5 and the IO buffers on both the adjacent sides thereof. Each of the IO buffer switching wirings 31 to 35 is formed in a stairway shape (shape in which it is bent more than once) and includes one or more (two in FIG. 1) steps. As the result of the IO buffer switching wirings 31 to 35 being formed in a bent stairway shape, the following can be implemented: they can be aligned in line and coupling can be changed between them and the bonding pads set in the IO buffer areas on both the left and right sides thereof. The shape of the IO buffer switching wirings 31 to 35 is not limited to a shape in which they are bent stepwise right up. They may be formed in any shape as long as they are not short-circuited to one another. For example, they may be formed in such a shape that they are bent stepwise right down or may be formed in the shape of a diagonal (right up, right down) straight or curved line.

The IO buffer switching wiring 31 is used to change a bonding pad electrically coupled to the IO buffer 1. The IO buffer switching wiring 31 is set over and astride three IO buffers: the corresponding IO buffer 1 and the IO buffers 2 located on both the adjacent sides thereof (only one side is shown in FIG. 1). It is so set that it partly overlaps with three pad coupling wirings: the pad coupling wiring 21 and the pad coupling wirings 22 located on both the adjacent sides thereof (only one side is shown in FIG. 1). The IO buffer switching wiring 31 is extended to the area of the IO buffer (not shown) set on the left of the IO buffer 1 and wired so that it is bent stepwise downward. At the same time, it is extended to the area of the IO buffer 2 set on the right of the IO buffer 1 and wired so that it is bent stepwise upward. The IO buffer switching wiring 31 is electrically coupled with the IO buffer 1 through the corresponding via 41 in an area where it overlaps with the corresponding IO buffer 1. The IO buffer switching wiring 31 can be electrically coupled with the pad coupling wiring 21 through the via 51b in an area where it overlaps with the pad coupling wiring 21; and it can be electrically coupled with the pad coupling wiring 22 through the via 51a in an area where it overlaps with the pad coupling wiring 22.

The IO buffer switching wiring 32 is used to change a bonding pad electrically coupled to the IO buffer 2. The IO buffer switching wiring 32 is set over and astride three IO buffers: the corresponding IO buffer 2 and the IO buffers 1, 3 located on both the adjacent sides thereof. It is so set that it partly overlaps with three pad coupling wirings: the pad coupling wiring 22 and the pad coupling wirings 21, 23 located on both the adjacent sides thereof. The IO buffer switching wiring 32 is extended to the area of the IO buffer 1 set on the left of the IO buffer 2 and wired so that it is bent stepwise downward. At the same time, it is extended to the area of the IO buffer 3 located on the right of the IO buffer 2 and wired so that it is bent stepwise upward. The IO buffer switching wiring 32 is electrically coupled with the IO buffer 2 through the corresponding via 42 in an area where it overlaps with the IO buffer 2. The IO buffer switching wiring 32 can be electrically coupled with the pad coupling wiring 21 through the via 52c in an area where it overlaps with the pad coupling wiring 21; it can be electrically coupled with the pad coupling wiring 22 through the via 52b in an area where it overlaps with the pad coupling wiring 22; and it can be electrically coupled with the pad coupling wiring 23 through the via 52a in an area where it overlaps with the pad coupling wiring 23.

The IO buffer switching wiring 33 is used to change a bonding pad electrically coupled to the IO buffer 3. The IO buffer switching wiring 33 is set over and astride three IO buffers: the corresponding IO buffer 3 and the IO buffers 2, 4 located on both the adjacent sides thereof. It is so set that is partly overlaps with three pad coupling wirings: the pad coupling wiring 23 and the pad coupling wirings 22, 24 located on both the adjacent sides thereof. The IO buffer switching wiring 33 is extended to the area of the IO buffer 2 set on the left of the IO buffer 3 and wired so that it is bent stepwise downward. At the same time, it is extended to the area of the IO buffer 4 located on the right of the IO buffer 3 and wired so that it is bent stepwise upward. The IO buffer switching wiring 33 is electrically coupled with the IO buffer 3 through the corresponding via 43 in an area where it overlaps with the corresponding IO buffer 3. The IO buffer switching wiring 33 can be electrically coupled with the pad coupling wiring 22 through the via 53c in an area where it overlaps with the pad coupling wiring 22; it can be electrically coupled with the pad coupling wiring 23 through the via 53b in an area where it overlaps with the pad coupling wiring 23; and it can be electrically coupled with the pad coupling wiring 24 through the via 53a in an area where it overlaps with the pad coupling wiring 24.

The IO buffer switching wiring 34 is used to change a bonding pad electrically coupled to the IO buffer 4. The IO buffer switching wiring 34 is set over and astride three IO buffers: the corresponding IO buffer 4 and the IO buffers 3, 5 located on both the adjacent sides thereof. It is so set that it partly overlap with three pad coupling wirings: the pad coupling wiring 24 and the pad coupling wirings 23, 25 located on both the adjacent sides thereof. The IO buffer switching wiring 34 is extended to the area of the IO buffer 3 set on the left of the IO buffer 4 and wired so that it is bend stepwise downward. At the same time, it is extended to the area of the IO buffer 5 located on the right of the IO buffer 4 and wired so that it is bent stepwise upward. The IO buffer switching wiring 34 is electrically coupled with the IO buffer 4 through the corresponding via 44 in an area where it overlaps with the corresponding IO buffer 4. The IO buffer switching wiring 34 can be electrically coupled with the pad coupling wiring 23 through the via 54c in an area where it overlaps with the pad coupling wiring 23; it can be electrically coupled with the pad coupling wiring 24 through the via 54b in an area where it overlaps with the pad coupling wiring 24; and it can be electrically coupled with the pad coupling wiring 25 through the via 54a in an area where it overlaps with the pad coupling wiring 25.

The IO buffer switching wiring 35 is used to change a bonding pad electrically coupled to the IO buffer 5. The IO buffer switching wiring 35 is set over and astride three IO buffers: the corresponding IO buffer 5 and the IO buffers 4 located on both the adjacent sides thereof (only one side is shown in FIG. 1). It is so set that it partly overlaps with three pad coupling wirings: the pad coupling wiring 25 and the pad coupling wirings 24 on both the adjacent sides thereof (only one side is shown in FIG. 1.) The IO buffer switching wiring 35 is extended to the area of the IO buffer 4 set on the left of the IO buffer 5 and wired so that it is bent stepwise downward. At the same time, it is extended to the area of the IO buffer (not shown) set on the right of the IO buffer 5 and wired so that it is bent stepwise upward. The IO buffer switching wiring 35 is electrically coupled with the IO buffer 5 through the corresponding via 45 in an area where it overlaps with the corresponding IO buffer 5. The IO buffer switching wiring 35 can be electrically coupled with the pad coupling wiring 24 through the via 55c in an area where it overlaps with the pad coupling wiring 24; and it can be electrically coupled with the pad coupling wiring 25 through the via 55b in an area where it overlaps with the pad coupling wiring 25.

The vias 41 to 45 electrically couple together the corresponding IO buffer switching wirings 31 to 35 in the second layer and the internal circuits of the corresponding IO buffers 1 to 5 in the third layer. (Refer to FIG. 2 and FIG. 3B.) In FIG. 1, the vias 41 to 45 are set in the same positions (fixed position in the center) in the areas of the corresponding IO buffers 1 to 5 and set along the arrangement of the IO buffers 1 to 5.

The vias 51a to 51c, 52a to 52c, 53a to 53c, 54a to 54c, 55a to 55c are selectively used according to customer requested specifications. They are used to electrically couple together the pad coupling wirings 21 to 25 in the uppermost layer and the IO buffer switching wirings 31 to 35 in the second layer which wirings are set according to customer requested specifications. The vias 51b, 52b, 53b, 54b, 55b make it possible to electrically couple together the corresponding IO buffer switching wirings 31 to 35 and the corresponding pad coupling wirings 21 to 25. In FIG. 1, they are set in positions where they overlap with the corresponding vias 41 to 45. In FIG. 1, the via 51a is set on the upper side of and on the right of the via 51b. Similarly, the vias 52a, 53a, 54a, 55a are also set in the same positions on the upper side of and on the right of the corresponding vias 52b, 53b, 54b, 55b. In FIG. 1, the via 51c is set on the lower side of and on the left of the via 51b. Similarly, the vias 52c, 53c, 54c, 55c are also set in the same positions on the lower side of and on the right of the corresponding vias 52b, 53b, 54b, 55b.

The via 51a makes it possible to electrically couple together the IO buffer switching wiring 31 and the pad coupling wiring 22. (Refer to FIG. 2 and FIG. 3A.) The via 51b makes it possible to electrically couple together the IO buffer switching wiring 31 and the pad coupling wiring 21. The via 52a makes it possible to electrically couple together the buffer switching wiring 32 and the pad coupling wiring 23. The via 52b makes it possible to electrically couple together the IO buffer switching wiring 32 and the pad coupling wiring 22. The via 52c makes it possible to electrically couple together the IO buffer switching wiring 32 and the pad coupling wiring 21. (Refer to FIG. 2 and FIG. 3C.) The via 53a makes it possible to electrically couple together the IO buffer switching wiring 33 and the pad coupling wiring 24 (Refer to FIG. 2 and FIG. 3A.) The via 53b makes it possible to electrically couple together the IO buffer switching wiring 33 and the pad coupling wiring 23. The via 53c makes it possible to electrically couple together the IO buffer switching wiring 33 and the pad coupling wiring 22. The via 54a makes it possible to electrically couple together the IO buffer switching wiring 34 and the pad coupling wiring 25. The via 54b makes it possible to electrically couple together the buffer switching wiring 34 and the pad coupling wiring 24. The via 54c makes it possible to electrically couple together the IO buffer switching wiring 34 and the pad coupling wiring 23. (Refer to FIG. 2 and FIG. 3C.) The via 55b makes it possible to electrically couple together the IO buffer switching wiring 35 and the pad coupling wiring 25. (Refer to FIG. 2 and FIG. 3B.) The via 55c makes it possible to electrically couple together the IO buffer switching wiring 35 and the pad coupling wiring 24.

Description will be given to how to change the alignment sequence of the bonding pads (terminals) in an IO area of the semiconductor integrated circuit in Exemplary Embodiment 1 of the invention.

In general, the IO buffers 1 to 5 and the bonding pads 11 to 15 in the semiconductor integrated circuit are determined and coupled to a design specification for terminal arrangement in the initial design development stage. When there is no requirement in the design specification, in general, the following measure is taken so that the wiring routes are shortened and made even: the bonding pad 11 is coupled with the IO buffer 1; the bonding pad 12 is coupled with the IO buffer 2; the bonding pad 13 is coupled with the IO buffer 3; the bonding pad 14 is coupled with the IO buffer 4; and the bonding pad 15 is coupled with the IO buffer 5. That is, of the vias 51a to 51c, 52a to 52c, 53a to 53c, 54a to 54c, 55a to 55c in FIG. 1, the vias 51b, 52b, 53b, 54b, 55b are selected. As a result, the bonding pad 11 is electrically coupled with the IO buffer 1 through the pad coupling wiring 21, via 51b, IO buffer switching wiring 31, and via 41; the bonding pad 12 is coupled with the IO buffer 2 through the pad coupling wiring 22, via 52b, IO buffer switching wiring 32, and via 42; the bonding pad 13 is coupled with the IO buffer 3 through the pad coupling wiring 23, via 53b, IO buffer switching wiring 33, and via 43; the bonding pad 14 is coupled with the IO buffer 4 through the pad coupling wiring 24, via 54b, IO buffer switching wiring 34, and via 44; and the bonding pad 15 is coupled with the IO buffer 5 through the pad coupling wiring 25, via 55b, IO buffer switching wiring 35, and via 45.

However, it may become necessary to change the alignment sequence of the terminals of the semiconductor integrated circuit in the final stage of designing because of, for example, the great influence of noise on adjacent wirings over the board substrate. As an example, it will be assumed that it becomes necessary to change the coupling between the bonding pads 11, 12 and the IO buffers 2, 1 and change the coupling between the bonding pads 13, 14 and the IO buffers 4, 3. In this case, as illustrated in FIG. 2 and FIGS. 3(A) to 3(C), the vias 51a, 52c, 53a, 54c, 55b are selected. As a result, the bonding pad 11 is electrically coupled with the IO buffer 2 through the pad coupling wiring 21, via 52c, IO buffer switching wiring 32, and via 42; the bonding pad 12 is coupled with the IO buffer 1 through the pad coupling wiring 22, via 51a, IO buffer switching wiring 31, and via 41; the bonding pad 13 is coupled with the IO buffer 4 through the pad coupling wiring 23, via 54c, IO buffer switching wiring 34, and via 44; the bonding pad 14 is coupled with the IO buffer 3 through the pad coupling wiring 24, via 53a, IO buffer switching wiring 33, and via 43; and the bonding pad 15 is coupled with the IO buffer 5 through the pad coupling wiring 25, via 55b, IO buffer switching wiring 35, and via 45.

As mentioned above, the vias 51a to 51c, 52a to 52c, 53a to 53c, 54a to 54c, 55a to 55c are selected and set according to design specifications. This makes it possible to change the coupling between the bonding pads 11 to 15 and the IO buffer 1 to 5 without change to the positions of the IO buffers 1 to 5. Thus the alignment sequence of the terminals can be easily changed.

Description will be given to a problem that arises when the configuration of the semiconductor integrated circuit in Exemplary Embodiment 1 of the invention is not adopted with reference to the drawings. FIG. 9 is a plan view partly illustrating an example of part of an IO area and part of a core area of a semiconductor integrated circuit in Related Art 1. FIG. 10 is a plan view partly illustrating an example of a wiring coupling method in an IO area of a semiconductor integrated circuit in Related Art 1. Related Art 1 corresponds to Japanese Unexamined Patent Publication No. 2007-305822 (FIG. 1) and Related Art 1 is an example in which Related Art 1 is applied to change the alignment sequence of terminals.

For example, the semiconductor integrated circuit in Related Art 1 has a CUP (Circuit Under Pad) structure in which coupling pads 141a to 141c, 142a to 142d (bonding pads) and IO cells 131a to 131g (IO buffers) set thereunder are coupled together through vias 161. (Refer to FIG. 9.) In the CUP structure, in general, the coupling pads 141a to 141c, 142a to 142d and the IO cells 131a to 131g are fixed and set with the one-to-one relation of coupling. It is widely known that adoption of the CUP structure contributes to chip size reduction.

When the ordinary constituent part shown in Related Art 1 (Refer to FIG. 9) is extracted and given a detailed relation of coupling with an internal logical gate portion, for example, Related Art 1 (Refer to FIG. 10) is obtained. That is, the coupling pads 141a to 141c, 142a to 142d are respectively coupled to the corresponding IO buffers 131a to 131g through the vias 161. The IO buffers 131a to 131g are respectively coupled with first layer signal wirings 151. The first layer signal wirings 151 are respectively coupled to the corresponding logical gate blocks in an internally set logical gate block array 181.

When it becomes necessary to change coupling pads because of a customer's request, failure to attain an intended electrical characteristic, or the like, the following may take place sometimes: a shift of the arrangement in the direction of alignment of the IO buffers due to change of IO buffers and a difference in size between changed IO buffers may be involved. However, as an example, in the following description, it will be assumed that they are identical in size and only signals coupled to the IO buffer 131e and the IO buffer 131f are changed.

In the right first layer signal wiring 151 of the first layer signal wirings 151 coupled to the IO buffer 131f, the coupling route of wiring is changed by taking the following measure: the wiring layer is changed to a different layer by a second layer additional signal wiring 172 and an additional via 171 by wiring coupling change; and further, the first layer signal wiring deleted portion 153 is deleted by wiring coupling change. In conjunction with the deletion of wiring, upstream of the deleted portion of wiring (logical gate block array 181 side), a first layer additional signal wiring 152 is added in the same layer as the first layer signal wiring 151 to change the coupling route of wiring. Similarly, coupling change is also carried out with respect to the signal wirings of the left first layer signal wiring 151 of the first layer signal wirings 151 coupled to the IO buffer 131f and the IO buffer 131e.

Further, the wiring resistance and the wiring capacitance are largely varied by addition of vias and wiring route change due to the change of wiring layers in the coupling route change. For this reason, it is necessary to review excess or deficiency of drive capability also in a logical gate that drives signals. In cases where it is determined at this time that drive capability is not matched, a new wiring change is required for recoupling to a logical gate block having appropriate drive capability. As the result of this coupling change, the logical gate block (logical gate block deleted part 183) is deleted and a logical gate block (addition logical gate block 182) newly added by the coupling change is coupled.

As the result of wiring route change, further, the following are indispensable: check on and verification of signal coupling, verification of intervals between set signal wirings, verification of change in the delay of changed parts and operation timing resulting from change to the coupling of logical gate blocks, and the like.

To couple together coupling pads and IO buffers, an automatic wiring tool is often used. However, it is difficult to use an automatic tool in such change work as in Related Art 1 (Refer to FIG. 10) and re-layout, such as wiring correction, is often manually carried out. When there are many points of change, for this reason, correcting work requires much time and erroneous correction is prone to be involved. Change of a wiring route varies wiring resistance and wiring capacitance and as a result, circuit characteristics are varied. For this reason, it is indispensable to carry out layout verification and operation timing verification. Therefore, techniques using conventional technology increase the influence of reversion of layout design and this poses a problem of a lengthened design period.

In Exemplary Embodiment 1 (Refer to FIG. 1), meanwhile, the measure described below is taken. An IO buffer switching wiring for changing the coupling between any IO buffer and a bonding pad coupled therewith to the coupling between the IO buffer and a different bonding pad is wired so that the following is implemented: it is extended to the area of another IO buffer set next to or farther away from the relevant IO buffer. The IO buffer switching wiring of the relevant IO buffer is installed in parallel with the IO buffer switching wirings of adjacent other IO buffers without short-circuiting therebetween. This makes it possible to solve the following problem associated with conventional technologies: when the coupling between bonding pads and IO buffers is changed, the reversion of layout design has great influence and the design period is lengthened.

More specific description will be given. According to Exemplary Embodiment 1, any IO buffer has an IO buffer switching wiring extended to the area of another IO buffer set next to or farther away from the relevant IO buffer. This makes it possible to easily couple together the relevant IO buffer and a bonding pad located above an IO buffer adjacent thereto through the IO buffer switching wiring. Lengthening of a design period can be prevented by correcting the arrangement of a bonding pad coupled with the relevant IO buffer without shifting the position of the relevant IO buffer.

In Exemplary Embodiment 1, the coupling is changed by only vias and thus electrical characteristics do not fluctuate so much. IO buffers are provided with large drive capability for driving capacitors coupled to external terminals. Therefore, even though the above coupling between bonding pads and IO buffers is changed, circuit characteristics are not varied and thus it is unnecessary to carry out layout verification or operation timing verification. As a result, a design period is not lengthened.

In the description of Exemplary Embodiment 1, a case where the following measure is taken has been taken as an example: the IO buffer switching wiring of any IO buffer is extended to the areas of the IO buffers set on both the immediately adjacent sides thereof; and it is thereby made possible to freely change the coupling between the IO buffer and bonding pads existing in both adjacent areas. Instead, the number of bonding pads to which coupling can be changed may be increased by extending the IO buffer switching wiring to the areas of two or more IO buffers on either adjacent side or on both adjacent sides thereof. This will be described in relation to other Exemplary Embodiments. In the description of Exemplary Embodiment 1, a case where the CUP (Circuit Under Pad) structure is used has been taken as an example. However, the application of the invention is not limited to the CUP structure.

According to Exemplary Embodiment 1, the following effects are obtained:

First, when the coupling between the bonding pads 11 to 15 and the IO buffers 1 to 5 is to be changed, the change work can be carried out in a shorter time than conventional. The reason for this will be described below. The bonding pads 11 to 15 respectively have the bonding pad coupling vias 51*a* to 51*c*, 52*a* to 52*c*, 53*a* to 53*c*, 54*a* to 54*c*, 55*a* to 55*c*, the IO buffer switching wirings 31 to 35, and the IO buffer switching vias 41 to 45. The IO buffer switching wirings 31 to 35 are installed astride one or more IO buffers on either side or both sides in the direction of the arrangement of the IO buffers 1 to 5. Change of coupling can be carried out by changing only vias. This facilitates correction and reduces variation in electrical characteristics. The scale of verification arising from correction is reduced and significant reversion does no occur in designing.

Second, the relation of coupling between pads and IO buffers can be changed without increase in chip area. The reason for this will be described below. The IO buffer switching wirings 31 to 35 are formed in a stairway shape and respectively included in the respective areas of the corresponding IO buffers 1 to 5. This makes it possible to make all the IO buffer switching wirings 31 to 35 identical in shape. Consequently, the IO buffer switching wirings 31 to 35 can be adjacently set over the adjacently set IO buffers 1 to 5 so that the IO buffer switching wirings 31 to 35 do not overlap with one another. As a result, the arrangement positions of the contacts 41 to 45 that couple together the IO buffers 1 to 5 and the IO buffer switching wirings 31 to 35 can be made constant and it is unnecessary to prepare multiple kinds of IO buffers. The coupling can be changed by setting the IO buffer switching wirings 31 to 35 in identical places over the corresponding IO buffers 1 to 5 and this facilitates designing.

Exemplary Embodiment 2

Description will be given to a semiconductor integrated circuit in Exemplary Embodiment 2 of the invention with reference to the drawings. FIG. 4 is a plan view partly illustrating the configuration of an IO area of the semiconductor integrated circuit in Exemplary Embodiment 2 of the invention. FIG. 5 is a plan view partly illustrating an example of a wiring coupling method in an IO area of the semiconductor integrated circuit in Exemplary Embodiment 2 of the invention.

In the semiconductor integrated circuit in Exemplary Embodiment 2, as illustrated in FIG. 4, single-row arrangement is adopted and the bonding pads 12 to 14 are arranged in a single row one the upper side (the lower side is also acceptable). In other respects, the configuration is the same as in Exemplary Embodiment 1.

FIG. 5 illustrates an example in which it becomes necessary to change the coupling between the bonding pads 12, 13 and the IO buffers 3, 2. In this case, the vias 52*a*, 53*c*, 54*b* are selected. As a result, the bonding pad 12 is coupled with the IO buffer 3 through the pad coupling wiring 22, via 53c, IO buffer switching wiring 32, and via 43; the bonding pad 13 is coupled with the IO buffer 2 through the pad coupling wiring 23, via 52a, IO buffer switching wiring 32, and via 42; and the bonding pad 14 is coupled with the IO buffer 4 through the pad coupling wiring 24, via 54b, IO buffer switching wiring 34, and via 44.

According to Exemplary Embodiment 2, the same effects as according to Exemplary Embodiment 1 are obtained.

Exemplary Embodiment 3

Description will be given to a semiconductor integrated circuit in Exemplary Embodiment 3 of the invention with reference to the drawings. FIG. 6 is a plan view partly illustrating the configuration of an IO area of the semiconductor integrated circuit in Exemplary Embodiment 3 of the invention. FIG. 7 is a plan view partly illustrating an example of a wiring coupling method in an IO area of the semiconductor integrated circuit in Exemplary Embodiment 3 of the invention.

In the semiconductor integrated circuit in Exemplary Embodiment 3, as illustrated in FIG. 6, single-row arrangement is adopted and the bonding pads 12 to 15 are arranged in a single row one the upper side (the lower side is also acceptable). In addition, the number of steps of each of the buffer switching wirings 31 to 35 is reduced to two (the lowest step is deleted). In other respects, the configuration is the same as in Exemplary Embodiment 1.

FIG. 7 illustrates an example in which it becomes necessary to change the IO buffers coupled to the bonding pads 12, 13, 14. In this case, the vias 52a, 53c, 54b are selected. As a result, the bonding pad 12 is coupled with an IO buffer (not shown, equivalent to the IO buffer 1 in FIG. 1) through the pad coupling wiring 22, via 51a, IO buffer switching wiring 31, and a via (not shown, equivalent to the via 41 in FIG. 1); the bonding pad 13 is coupled with the IO buffer 2 through the pad coupling wiring 23, via 52a, IO buffer switching wiring 32, and via 42; the bonding pad 14 is coupled with the IO buffer 3 through the pad coupling wiring 24, via 53a, IO buffer switching wiring 33, and via 43; and the bonding pad 15 is coupled with the IO buffer 5 through the pad coupling wiring 25, via 55b, IO buffer switching wiring 35, and via 45. In this case, the IO buffer 4 or the IO buffer switching wiring 34 is not used and a via coupled to the IO buffer switching wiring 34 does not exist.

According to Exemplary Embodiment 3, the same effects as according to Exemplary Embodiment 1 are obtained. Further, though the range within which IO buffers are coupled to bonding pads is narrowed as compared with Exemplary Embodiment 1, the IO area can be reduced.

Exemplary Embodiment 4

Description will be given to a semiconductor integrated circuit in Exemplary Embodiment 4 of the invention with reference to the drawing. FIG. 8 is a plan view partly illustrating the configuration of an IO area of the semiconductor integrated circuit in Exemplary Embodiment 4 of the invention.

In the semiconductor integrated circuit in Exemplary Embodiment 4, as illustrated in FIG. 8, single-row arrangement is adopted and the bonding pads 11 to 15 are arranged in a single row on the upper side (the lower side is also acceptable). In addition, the number of steps of each of the buffer switching wirings 31 to 35 is increased to four (the uppermost step is added). The via 51d is set on the upper side of and on the right of the via 51a. Similarly, the vias 52d, 53d, 54d are also set on the upper side of and on the right of the corresponding vias 52a, 53a, 54a. The via 51d makes it possible to electrically couple together the IO buffer switching wiring 31 and the pad coupling wiring 23. The via 52d makes it possible to electrically couple together the IO buffer switching wiring 32 and the pad coupling wiring 24. The via 53d makes it possible to electrically couple together the buffer switching wiring 33 and the pad coupling wiring 25. In other respects, the configuration is the same as in Exemplary Embodiment 1.

According to Exemplary Embodiment 4, the same effects as according to Exemplary Embodiment 1 are obtained. Further, though the IO area is increased as compared with Exemplary Embodiment 1, the range within IO buffers are coupled to bonding pads can be widened.

Embodiments or working examples can be modified or adjusted within the framework of all the disclosures of the invention (including "What is claimed is") and based on the basic technical ideas thereof. Further, various disclosed elements can be variously combined or selected within the framework of "What is claimed is" of the invention. That is, the invention includes various modifications and corrections those skilled in the art can make according to all the disclosures including "What is claimed is" and the technical ideas thereof, needless to add.

What is claimed is:

1. A semiconductor integrated circuit comprising:
   a plurality of IO (Input/Output) buffers arrayed in line;
   a plurality of pad coupling wirings respectively arrayed in correspondence with the IO buffers and set in a layer different from the layer of the IO buffers; and
   a plurality of IO buffer switching wirings respectively arrayed in line in correspondence with the IO buffers and the pad coupling wirings, set in a layer different from the layers of the IO buffers and the pad coupling wirings so that the IO buffer switching wirings overlap with part of their corresponding pad coupling wirings, and extended to one or more other pad coupling wirings set adjacently to the corresponding pad coupling wirings,
   wherein each of the IO buffer switching wirings is formed in an identical shape so that the IO buffer switching wiring is not short-circuited to adjacent other IO buffer switching wirings, and
   wherein each of the IO buffers is electrically coupled with its corresponding IO buffer switching wiring in an identical position.

2. The semiconductor integrated circuit according to claim 1,
   wherein each of the IO buffer switching wirings is formed in a stairway shape and includes one or more steps.

3. The semiconductor integrated circuit according to claim 1,
   wherein a portion of wiring is extended from each of the IO buffer switching wirings and is set on either or both sides of an area where the IO buffer switching wiring overlaps with part of its corresponding pad coupling wiring in the direction of column.

4. The semiconductor integrated circuit according to claim 1,
   wherein each of the IO buffer switching wirings is set between its corresponding IO buffer and its corresponding pad coupling wiring with a distance in between.

5. The semiconductor integrated circuit according to claim 1, comprising:
   a plurality of pads coupled to their corresponding IO buffer switching wirings, wherein the pads are arranged in a staggered pattern or in a single row.

6. The semiconductor integrated circuit according to claim 1, comprising:
- a plurality of first vias set in correspondence with the IO buffers and the IO buffer switching wires and electrically coupling together their corresponding IO buffers and their corresponding IO buffer switching wirings; and
- a plurality of second vias capable of electrically coupling together the IO buffer switching wirings and their corresponding pad coupling wirings or the adjacent other pad coupling wirings.

7. The semiconductor integrated circuit according to claim 6,
wherein when the second vias electrically couple together the IO buffer switching wirings and their corresponding pad coupling wirings, the second vias are set in positions where the second vias overlap with the first vias.

8. The semiconductor integrated circuit according to claim 6,
wherein when the second vias electrically couple together the IO buffer switching wirings and the adjacent other pad coupling wirings, the second vias are set in positions shifted from the positions of their corresponding first vias in the direction of row.

9. The semiconductor integrated circuit according to claim 1,
wherein of the IO buffer switching wirings, a predetermined IO buffer switching wiring is not coupled to the IO buffer through its corresponding first via.

10. The semiconductor integrated circuit according to claim 1,
wherein of the IO buffer switching wirings, a predetermined IO buffer switching wiring is not coupled to the its corresponding pad coupling wiring or the other pad coupling wiring through its corresponding second via.

* * * * *